(12) United States Patent
Yuuki (10) Patent No.: US 10,571,987 B2
(45) Date of Patent: Feb. 25, 2020

(54) POWER SUPPLY DEVICE, CHARGING DEVICE, CONTROLLING METHOD, ELECTRONIC EQUIPMENT, AND ELECTRICALLY POWERED VEHICLE

(71) Applicant: Sony Corporation, Tokyo (JP)

(72) Inventor: Hitoshi Yuuki, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 16/087,250

(22) PCT Filed: Jan. 26, 2017

(86) PCT No.: PCT/JP2017/002622
§ 371 (c)(1),
(2) Date: Sep. 21, 2018

(87) PCT Pub. No.: WO2017/169042
PCT Pub. Date: Oct. 5, 2017

(65) Prior Publication Data
US 2019/0101967 A1 Apr. 4, 2019

(30) Foreign Application Priority Data

Mar. 28, 2016 (JP) ................................ 2016-063745

(51) Int. Cl.
*G06F 1/26* (2006.01)
*H02M 3/335* (2006.01)
(Continued)

(52) U.S. Cl.
CPC ............... *G06F 1/266* (2013.01); *G06F 1/28* (2013.01); *G06F 1/3206* (2013.01); *H02J 3/381* (2013.01);
(Continued)

(58) Field of Classification Search
CPC ............................ G06F 1/266; H02M 1/4225
See application file for complete search history.

(56) References Cited

U.S. PATENT DOCUMENTS

2012/0127764 A1* 5/2012 Phadke ................... H02J 3/383
363/37
2013/0169990 A1 7/2013 Yoshioka et al.
2016/0036266 A1* 2/2016 Mao ........................ H02J 7/045
320/162

FOREIGN PATENT DOCUMENTS

JP 7-322524 A 12/1995
JP 2006-230104 A 8/2006
(Continued)

OTHER PUBLICATIONS

International Search Report and English translation thereof dated Apr. 11, 2017 in connection with International Application No. PCT/JP2017/002622.
Written Opinion and English translation thereof dated Apr. 11, 2017 in connection with International Application No. PCT/JP2017/002622.
(Continued)

*Primary Examiner* — Daniel J Cavallari
(74) *Attorney, Agent, or Firm* — Wolf, Greenfield & Sacks, P.C.

(57) ABSTRACT

A power supply device includes: a first power supply circuit capable of exerting control of both boosting and bucking; a second power supply circuit configured to be supplied with an output of the first power supply circuit and cause an output to be controlled in accordance with a frequency or a pulse width; and a control unit configured to control the first and second power supply circuits. The control unit is configured to execute control while switching between first control in which the output of the first power supply circuit is made variable and the output of the second power supply (Continued)

circuit is accordingly made variable, and second control in which the output of the first power supply circuit is made constant and the output of the second power supply circuit is set to a predetermined output.

8 Claims, 6 Drawing Sheets

(51) Int. Cl.
*H02J 7/00* (2006.01)
*H02M 1/42* (2007.01)
*H02J 3/38* (2006.01)
*G06F 1/28* (2006.01)
*G06F 1/3206* (2019.01)
*H03K 7/08* (2006.01)
*H02M 1/00* (2006.01)

(52) U.S. Cl.
CPC ............ *H02J 7/00* (2013.01); *H02M 1/4225* (2013.01); *H02M 3/33569* (2013.01); *H03K 7/08* (2013.01); *H02M 2001/007* (2013.01); *H02M 2001/0058* (2013.01); *H02M 2001/4291* (2013.01)

(56) References Cited

FOREIGN PATENT DOCUMENTS

| | | |
|---|---|---|
| JP | 2010-263683 A | 11/2010 |
| JP | 2013-152440 A | 8/2013 |
| JP | 2014-135846 A | 7/2014 |

OTHER PUBLICATIONS

International Preliminary Report on Patentability and English translation thereof dated Oct. 11, 2018 in connection with International Application No. PCT/JP2017/002622.

* cited by examiner

POWER SUPPLY DEVICE, CHARGING DEVICE, CONTROLLING METHOD, ELECTRONIC EQUIPMENT, AND ELECTRICALLY POWERED VEHICLE

CROSS REFERENCE TO RELATED APPLICATIONS

This is a U.S. National Stage Application under 35 U.S.C. § 371, based on International Application No. PCT/JP2017/002622, filed Jan. 26, 2017, which claims priority to Japanese Patent Application JP 2016-063745, filed Mar. 28, 2016, each of which is hereby incorporated by reference in its entirety.

TECHNICAL FIELD

The present technology relates to a power supply device, a charging device, a controlling method, electronic equipment, and an electrically powered vehicle.

BACKGROUND ART

As a charging system for a secondary battery, for example, a lithium ion secondary battery, a constant current constant voltage (CCCV) charging system in which constant current charging and constant voltage charging are combined is known. In the CCCV charging system, charging is performed at a constant current until the battery voltage reaches a predetermined voltage, and charging is performed at a constant voltage after the predetermined voltage is attained. Then, charging is completed at a time point when the charging current converges to substantially 0. As a power supply circuit for charging, a highly-efficient and low-noise resonant converter is used, for example.

For example, as described in Patent Literature 1, a configuration in which a power factor correction converter and a series resonant converter are connected in series is known. The output of the power factor correction converter is fixed at a constant voltage, and charging control is performed by controlling the output of the series resonant converter. The configuration described in Patent Literature 1 is for achieving constant current properties at a low voltage and a low current for preliminary charging. In Patent Literature 1, the output of the power factor correction converter is switched between two levels, and the output voltage is controlled by a DC-DC converter for respective outputs. As a result, a low output voltage can be output.

CITATION LIST

Patent Literature

Patent Literature 1: JP 2014-135846A

DISCLOSURE OF INVENTION

Technical Problem

In the case of a power supply circuit in which a DC-DC converter (for example, a resonant converter) is used as described in Patent Literature 1, it is desired to control the output while maintaining sufficiently high efficiency.

Therefore, the present technology provides a power supply device, a charging device, a controlling method, electronic equipment, and an electrically powered vehicle made in view of such a point.

Solution to Problem

To solve the above problem, for example, the present technology may be a power supply device including:
a first power supply circuit capable of exerting control of both boosting and bucking;
a second power supply circuit configured to be supplied with an output of the first power supply circuit and cause an output to be controlled in accordance with a frequency or a pulse width; and
a control unit configured to control the first and second power supply circuits.

The control unit is configured to execute control while switching between first control in which the output of the first power supply circuit is made variable and the output of the second power supply circuit is accordingly made variable, and second control in which the output of the first power supply circuit is made constant and the output of the second power supply circuit is set to a predetermined output.

The present technology may be electronic equipment configured to receive supply of electric power from the power supply device.

The present technology may be an electrically powered vehicle including the power supply device.

For example, the present technology may be a charging device including:
a first power supply circuit capable of exerting control of both boosting and bucking;
a second power supply circuit configured to be supplied with an output of the first power supply circuit and to cause an output to be controlled in accordance with a frequency or a pulse width; and
a control unit configured to control the first and second power supply circuits.

The control unit is configured to execute control while switching between first control in which the output of the first power supply circuit is made variable and the output of the second power supply circuit is accordingly made variable, and second control in which the output of the first power supply circuit is made constant and the output of the second power supply circuit is set to a predetermined output.

For example, the present technology may be a controlling method in which
a control unit executes first control and second control for a first power supply circuit capable of exerting control of both boosting and bucking, and a second power supply circuit configured to be supplied with an output of the first power supply circuit and to cause an output to be controlled in accordance with a frequency or a pulse width,
the first control is control in which an output of the first power supply circuit is made variable and the output of the second power supply circuit is accordingly made variable, and
the second control is control in which the output of the first power supply circuit is made constant and the output of the second power supply circuit is set to a predetermined output.

Advantageous Effects of Invention

According to at least one embodiment, it is possible to control the output while maintaining sufficiently high efficiency. Note that effects described herein are not necessarily limited, but any effect described in the present technology may be obtained.

MODE(S) FOR CARRYING OUT THE INVENTION

Hereinafter, one embodiment of the present technology will be described. Note that description will be provided in the following order.
<1. One embodiment>
<2. Application examples>
<3. Variants>

An embodiment(s) which will be described below is a suitable specific example of the present technology, and technically preferable various limitations are given. However, the scope of the present technology is not limited to these embodiments unless there is description that limits the present technology in the following description.

"As to General Power Supply Circuit for Charging"

As described above, in a general power supply circuit for charging, a highly-efficient and low-noise resonant converter is used. However, an LLC current resonant type DC-DC converter is a system of controlling an output voltage by frequency modulation. That is, when the frequency is raised, output electric power is reduced, and when the frequency is lowered, output electric power is increased. Such an LLC current resonant type DC-DC converter is not suitable for adjustment to wide output voltages under a condition that an input voltage is made constant. In particular, since reducing the output voltage under a condition that electric output power is small is controlled by raising the frequency in terms of properties, the frequency cannot be raised infinitely, leading to loss of control. To take a measure for this, a non-insulation type DC-DC converter is provided at a latter stage in order to adjust the output voltage widely, or a charging operation is achieved by exerting control through intermittent oscillation to reduce an apparent output voltage.

However, in the case of adding the DC-DC converter to the latter stage, the overall efficiency is reduced and the circuit scale is increased since the conversion efficiency of the DC-DC converter is added. In addition, an output ripple voltage in the state controlled by intermittent oscillation increases, which is not preferable for properties of a charging device. In addition, there is a frequency in which the highest efficiency is exercised for the frequency modulation type system, and the output conversion efficiency of the converter is reduced when departing from the frequency, and thus, it is difficult to maintain high efficiency in the entire region of the charging operation. Hereinafter, details of the present technology made in view of such points will be described.

1. One Embodiment

"Configuration Example of Charging Device"

Figure 1:
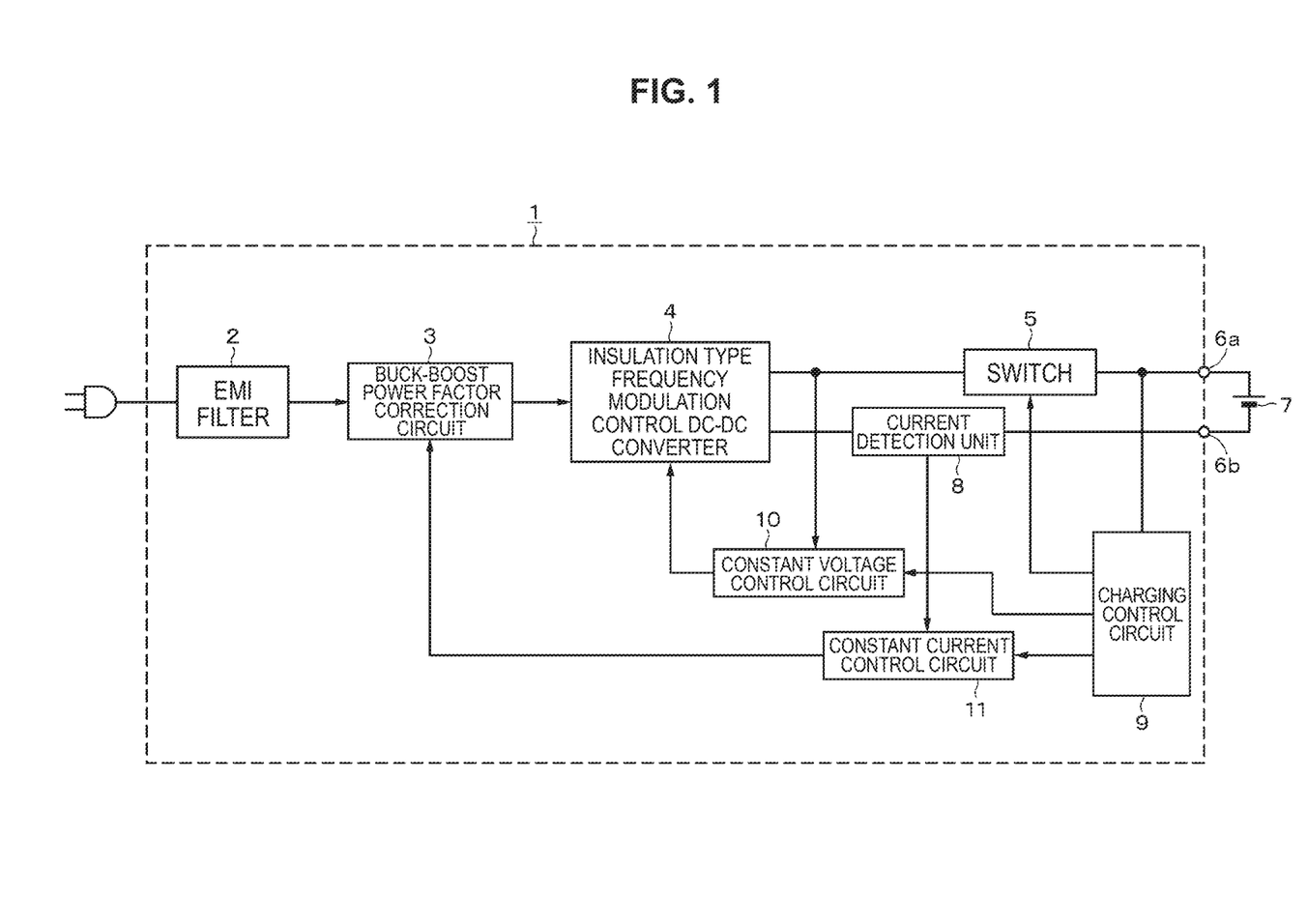
FIG. 1 is a block diagram of a charging device according to one embodiment of the present technology.

FIG. 1 is a diagram showing a configuration example of a power supply device according to one embodiment of the present technology. Note that, hereinafter, an example in which the power supply device is a charging device having the charging function will be described. A commercial power supply is supplied to a charging device 1 via a plug. AC power supply is supplied to a buck-boost power factor correction circuit 3 which is an example of a first power supply circuit via an electro magnetic interference (EMI) filter 2 of the charging device 1. An insulation type frequency modulation control DC-DC converter (hereinafter appropriately referred to as a frequency modulation control DC-DC converter) 4 which is an example of a second power supply circuit is connected to the output of the buck-boost power factor correction circuit 3. An example of the frequency modulation control DC-DC converter 4 is an LLC current resonant type converter.

One end of the output terminal of the frequency modulation control DC-DC converter 4 is led out as an output terminal 6a via a switch 5. The other end of the output terminal of the frequency modulation control DC-DC converter 4 is led out as an output terminal 6b via a current detection unit 8. The output terminal 6a of the frequency modulation control DC-DC converter 4 is connected to the positive electrode of a battery 7, and the output terminal 6b is connected to the negative electrode of the battery 7. The battery 7 is a lithium ion secondary battery, for example. Note that FIG. 1 shows one lithium ion secondary battery, whilst this may be a single cell, or may have a modular structure including a plurality of lithium ion secondary battery cells.

The voltage (battery voltage) of the output terminal 6a is supplied to a charging control circuit 9. The charging control circuit 9 outputs a control signal for the switch 5, a control signal for a constant voltage control circuit 10, and a control signal for a constant current control circuit 11. The constant voltage control circuit 10 controls the frequency modulation control DC-DC converter 4. The constant current control circuit 11 controls the buck-boost power factor correction circuit 3. Controlling functions that the charging control circuit 9, the constant voltage control circuit 10, and the constant current control circuit 11 have correspond to a control unit. These circuits may be implemented by one microcomputer or the like.

Figure 2:
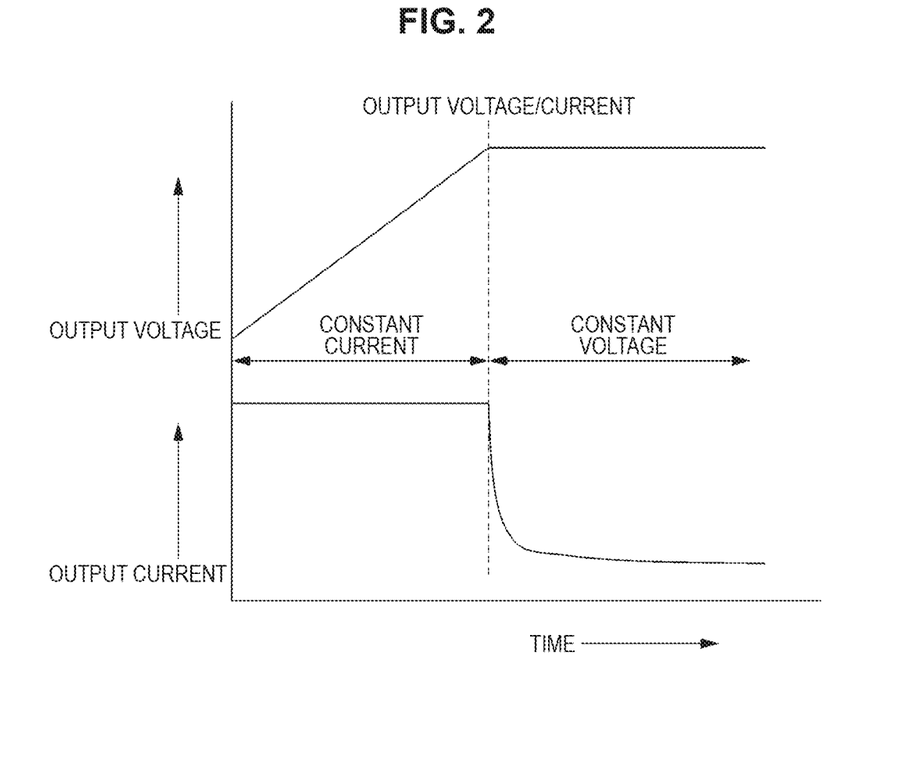
FIG. 2 is a schematic diagram for describing a constant current constant voltage charging system.

In the CCCV charging system, charging is performed at a constant current until the battery voltage reaches a predetermined voltage, and charging is performed at a constant voltage after the predetermined voltage is attained, as shown in FIG. 2. Then, charging is completed at a time point when the charging current converges to substantially 0. A first mode of charging at a constant current will be referred to as a constant current charging mode, and a second mode of charging at a constant voltage will be referred to as a constant voltage charging mode.

The buck-boost power factor correction circuit 3 is capable of exerting control of both boosting and bucking, and is usually controlled such that the output voltage becomes constant. In the constant current charging mode, a signal from the constant current control circuit 11 that receives a signal from the current detection unit 8 that detects an output current, and controls such that the output becomes a constant current intervenes in the control of the buck-boost power factor correction circuit 3 to control so as to change the output voltage.

The frequency modulation control DC-DC converter 4 is subjected to constant voltage control by frequency modulation, for example, so as to make the output voltage constant. On the other hand, in the constant current charging mode, the frequency modulation control DC-DC converter 4 is controlled so as to operate at a constant frequency in the vicinity of a resonant frequency at which the efficiency is maximized. Constant current control and constant voltage control are each controlled by the charging control circuit 9.

In the charging device 1, control is switched between modes of the constant current charging mode and the constant voltage charging mode. When in the constant current charging mode, the buck-boost power factor correction circuit 3 is controlled by the constant current control circuit 11, and the frequency modulation control DC-DC converter 4 is controlled in a fixed manner at a constant frequency. When in the constant voltage charging mode, the buck-boost power factor correction circuit 3 is controlled such that the output becomes a constant voltage, and the frequency modulation control DC-DC converter 4 is controlled by the constant voltage control circuit 10 so as to make the output voltage constant. Note that details of the operation in the charging device 1 will be described later.

Figure 3:
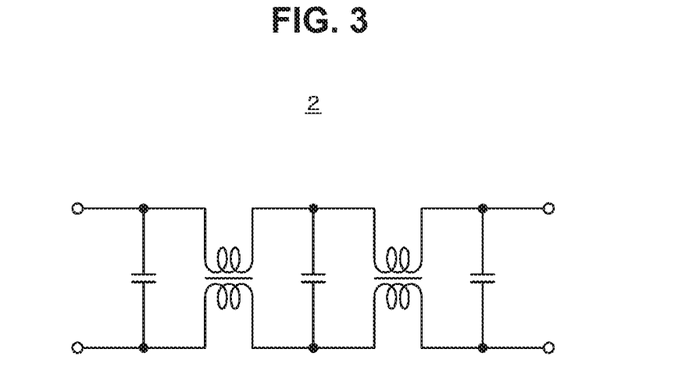
FIG. 3 is a connection diagram of an EMI filter according to one embodiment of the present technology.

FIG. 3 shows a specific configuration example of the EMI filter 2. The EMI filter 2 is an anti-noise component for use when taking an emission measure or an immunity measure in order to prevent electromagnetic interference (EMI), and is configured as a low-pass filter.

Figure 4:
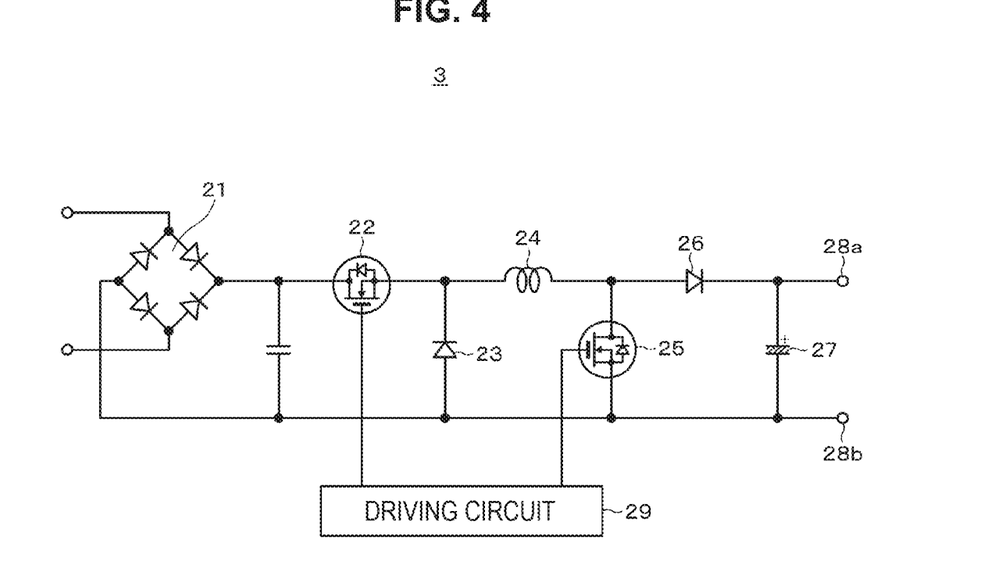
FIG. 4 is a connection diagram of a buck-boost type power factor correction converter according to one embodiment of the present technology.

FIG. 4 shows a specific example (schematic configuration) of the buck-boost power factor correction circuit 3. The output of a rectification circuit 21 of a bridge configuration that rectifies the commercial power supply is supplied to a buck type switching power supply circuit including an FET 22, a diode 23, and a coil 24. Further, a boost type switching power supply circuit including an FET 25, a diode 26, and a capacitor 27, and sharing the coil 24 with the buck type switching power supply circuit is connected. The output of the buck-boost power factor correction circuit 3 is taken out at output terminals 28*a* and 28*b*.

A driving circuit 29 that controls switching of the FET 22 and the FET 25 is provided. The driving circuit 29 is configured as a power factor correction (PFC) control circuit. By connecting the buck type switching power supply circuit and the boost type switching power supply circuit, the output can be changed in a wide range.

Figure 5:
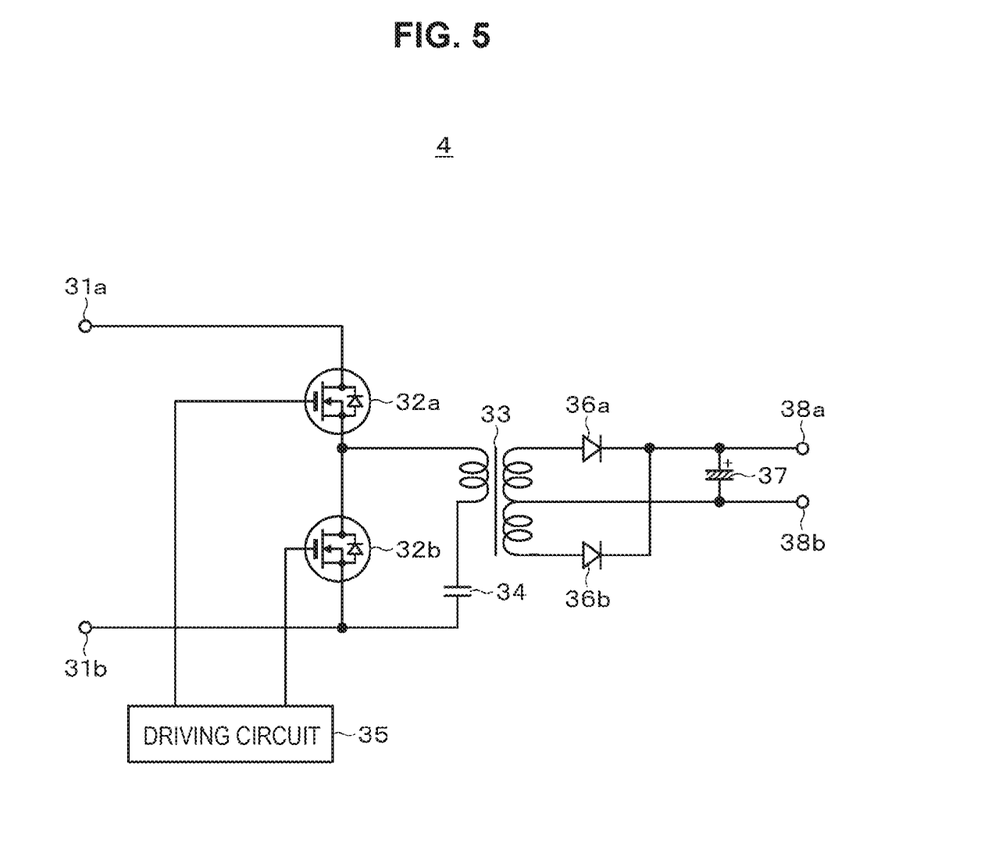
FIG. 5 is a connection diagram of a frequency modulation type DC-DC converter according to one embodiment of the present technology.

FIG. 5 shows a specific example (schematic configuration) of the frequency modulation control DC-DC converter 4. The configuration shown in FIG. 5 is an example of an LLC current resonant type (full-wave rectification type) DC-DC converter. Switching driving in the LLC current resonant type DC-DC converter, two switching elements turn on/off alternately, and a dead band in which both are in the off period is formed.

In the configuration shown in FIG. 5, FETs 32*a* and 32*b* are used as the switching elements. The FETs 32*a* and 32*b* are connected in series, and the output of the buck-boost power factor correction circuit 3 is supplied to terminals 31*a* and 31*b* connected to the drain of the FET 32*a* and the source of the FET 32*b*, respectively.

A series resonant circuit including the primary coil of a transformer 33, a leakage inductance component of the transformer 33, and a resonant capacitor 34 in parallel with the FET 32*a*. A driving circuit 35 is provided in order to drive the FETs 32*a* and 32*b*. A driving pulse for switching driving of the FETs 32*a* and 32*b* is generated by the driving circuit 35. The FETs 32*a* and 32*b* are switched in opposite phases.

A center tap of the transformer 33 is set at a secondary-side ground potential. An AC voltage induced to the secondary side by rectifier diodes 36*a* and 36*b* and a smoothing capacitor 37 is rectified, and the output voltage is taken out at output terminals 38*a* and 38*b*. Although not shown, the output voltage is detected, and in accordance with the detection result, the frequency of the driving pulse of the FETs 32*a* and 32*b* is controlled, and the output voltage is controlled to be a predetermined value.

Note that each of the configuration of the EMI filter 2 shown in FIG. 3, the configuration of the buck-boost power factor correction circuit 3 shown in FIG. 4, and the configuration of the frequency modulation control DC-DC converter 4 shown in FIG. 5 is one example, and another configuration can be used.

"Operation Example of Charging Device"

An operation example of the charging device 1 according to one embodiment of the present technology described above will be described. When connecting the battery 7 that requires charging to the output of the charging device 1, the charging control circuit 9 detects the battery state. In the case where it is determined as a result of detection that the constant current charging is necessary, the charging control circuit 9 instructs the constant voltage control circuit 10 of the frequency modulation control DC-DC converter 4 to operate in a fixed manner at a certain frequency (for example, a frequency having a value that improves the efficiency of the frequency modulation control DC-DC converter 4 and being close to the resonant frequency). The constant current control circuit 11 controls the buck-boost power factor correction circuit 3 so as to provide an output designated on the basis of a signal from the current detection unit 8, and when the voltage of the frequency modulation control DC-DC converter 4 becomes a voltage at which the battery 7 can be charged, the switch 5 is turned on, and charging is started.

Charging is continued at a constant current in this state, and in the case where the battery voltage reaches a certain constant voltage and it is determined that it is necessary to switch the charging mode to the constant voltage charging mode, the charging control circuit 9 outputs an instruction to the constant current control circuit 11 and the constant voltage control circuit 10. The constant current control circuit 11 exerts control of stopping control with the signal from the current detection unit 8, and causing the buck-boost power factor correction circuit 3 to fix the output voltage constant. The constant voltage control circuit 10 executes control of adjusting the frequency, and exerts frequency modulation control of making the output voltage of the frequency modulation control DC-DC converter 4 constant.

Figure 6:
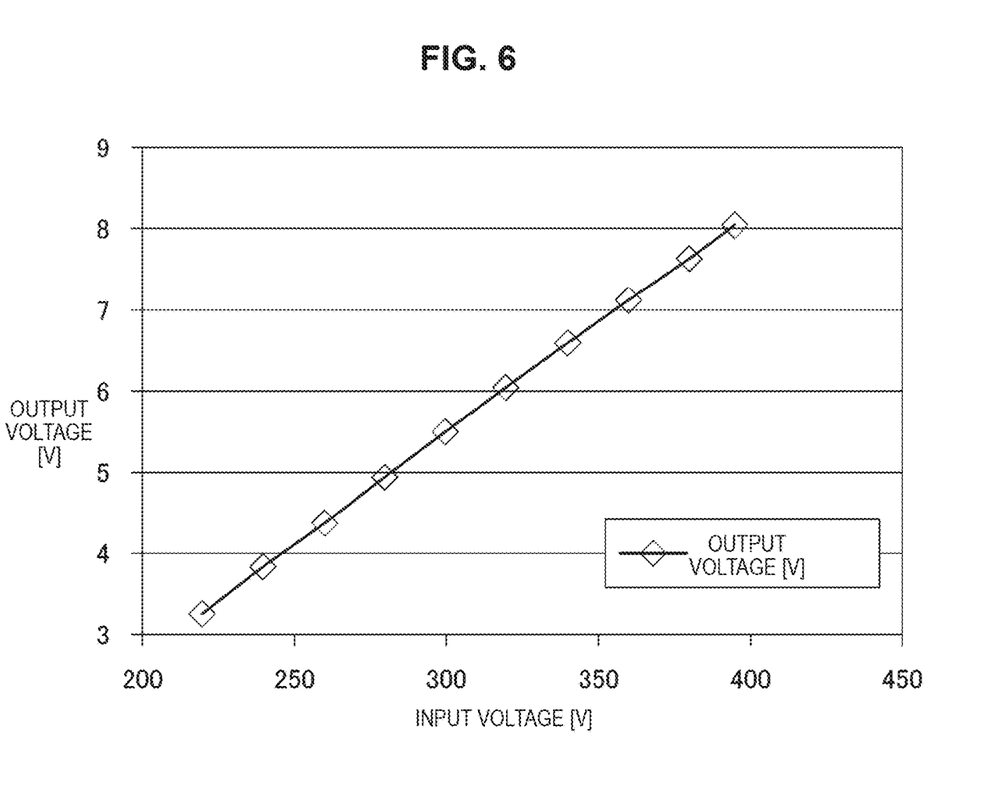
FIG. 6 is a schematic diagram for use in description of one embodiment of the present technology.

Voltage properties in the case of using an LLC current resonant type circuit as the frequency modulation control DC-DC converter 4 and changing the input voltage in a state where the switching frequency is fixed and the load current is made constant is shown in FIG. 6. By fixing the switching frequency, output electric power of the frequency modulation control DC-DC converter 4 is controlled to be constant. The graph of FIG. 6 reveals that, by operating the frequency modulation control DC-DC converter 4 at a fixed frequency and adjusting the input voltage with the buck-boost power factor correction circuit 3, a constant current charging operation for the charging device can be performed.

It is known that a circuit of a system that controls the output by the frequency, such as the LLC current resonant type DC-DC converter, is likely to achieve high efficiency by narrowing the input voltage range for controlling the output voltage to be constant. However, in the case of using this circuit for the charging device, the output voltage should be changed widely in a constant current charging period, and high efficiency is thus unlikely to be achieved, and the design becomes very complicated and troublesome. In the present technology, the DC-DC converter (the buck-boost power factor correction circuit 3) is controlled in the constant current charging mode, and the DC-DC converter (the frequency modulation control DC-DC converter 4) is controlled in the constant voltage charging mode. Through this control, by operating the frequency modulation control DC-DC converter 4 in a fixed manner at a frequency at which high efficiency can be achieved, and changing the output voltage of the power factor correction circuit which is an input voltage, charging in the constant current charging mode can be performed while maintaining sufficiently high efficiency. In addition, it is unnecessary to add a DC-DC converter, which can prevent the circuit scale from increasing. In addition, it is unnecessary to execute control by intermittent oscillation.

2. APPLICATION EXAMPLES

One embodiment of the present technology described above can be embodied as a charging device for a battery to be mounted on or to supply electric power to an apparatus such as electronic equipment, an electrically powered vehicle, or a power storage device, for example, or a power supply device having the respective components of the above-described charging device. Hereinafter, application examples will be described.

Examples of the electronic equipment can include a laptop personal computer, a smartphone, a tablet terminal, a personal digital assistant (PDA), a mobile phone, a wearable terminal, a cordless phone handset, a video movie, a digital still camera, an electronic book, an electronic dictionary, a music player, a radio, a headphone, a game console, a navigation system, a memory card, a pacemaker, a hearing aid, a power tool, an electric shaver, a refrigerator, an air conditioner, a television, a stereo, a water heater, a microwave oven, a dishwasher, a washing machine, a dryer, illumination equipment, a toy, a medical equipment, a robot, a road conditioner, a traffic signal, and the like.

In addition, the electrically powered vehicle can include a railway rolling stock, a golf cart, an electric cart, an electric vehicle (including a hybrid vehicle), and the like, and is used as a driving power supply or an auxiliary power supply for them.

Examples of the power storage device can include power supplies for electric power storage for buildings including houses or for power generation facilities, and the like.

Hereinafter, a specific example of a power storage system through use of a power storage device to which the above-described charging device (power supply device) of the present technology has been applied among the above-described application examples will be described.

This power storage system is electronic equipment that receives supply of electric power from the charging device (power supply device), for example. These power storage systems are implemented as systems that efficiently supply electric power in cooperation with an external electric power supply grid. Hereinafter, the power storage system will be described.

"Power Storage System in House as Application Example"

Figure 7:
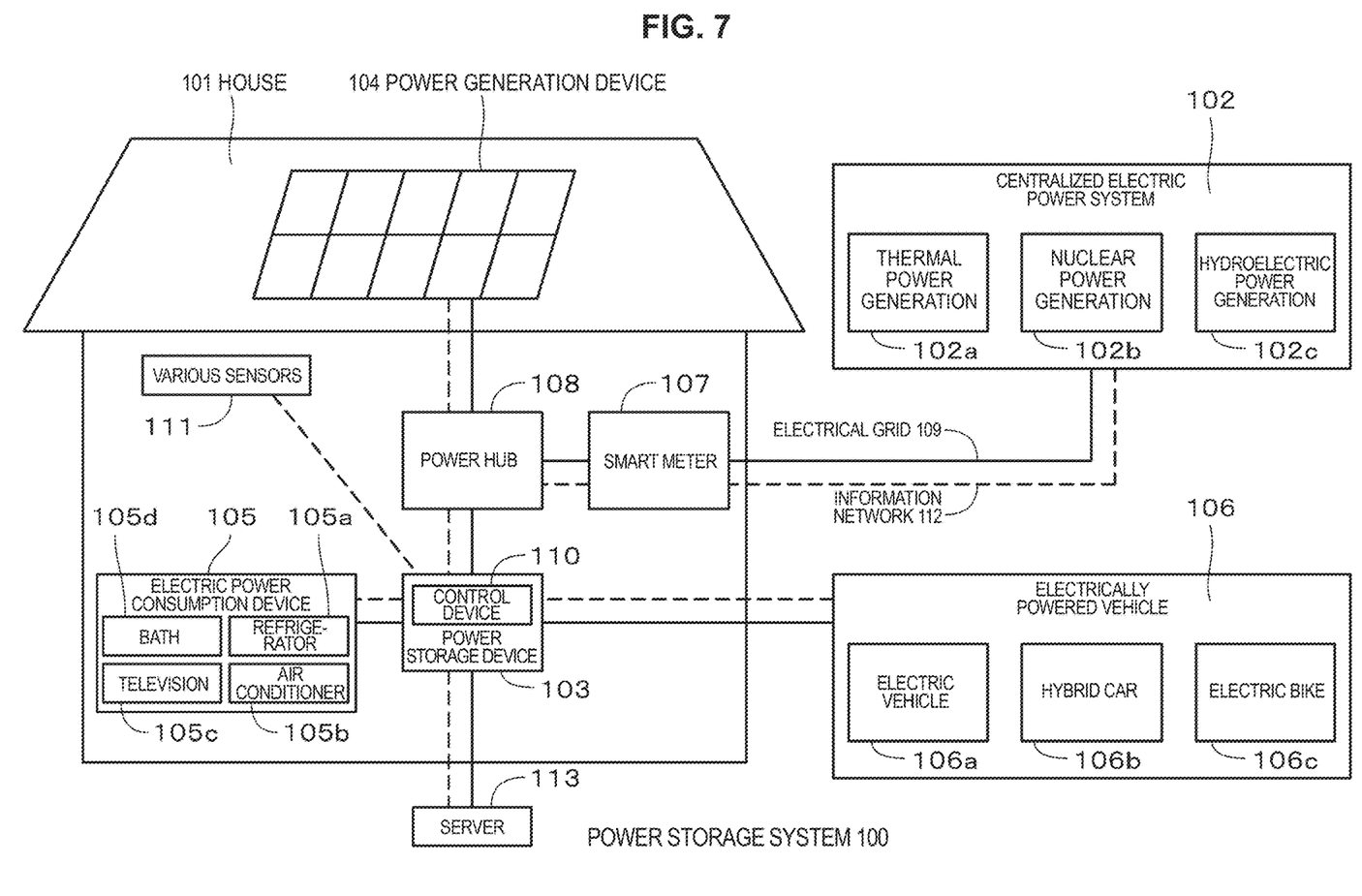
FIG. 7 is a block diagram showing an application example of the present technology.

An example of the power storage system to which the present technology is applicable will be described with reference to FIG. 7. In a power storage system 100 for a house 101, for example, electric power is supplied to a power storage device 103 from a centralized electric power system 102 such as thermal power generation 102a, nuclear power generation 102b, or hydroelectric power generation 102c via an electrical grid 109, an information network 112, a smart meter 107, a power hub 108, or the like. In combination with this, electric power is supplied to the power storage device 103 from an independent power supply such as a home power generation device 104. The electric power supplied to the power storage device 103 is stored. Electric power for use in the house 101 is fed using the power storage device 103. A similar power storage system can be used not only for the house 101, but also for a building.

The house 101 is provided with the power generation device 104, an electric power consumption device 105, the power storage device 103, a control device 110 that controls each device, the smart meter 107, and sensors 111 that acquire various types of information. The respective devices are connected with the electrical grid 109 and the information network 112. A solar cell, a fuel cell, or the like is utilized as the power generation device 104, and generated electric power is supplied to the electric power consumption device 105 and/or the power storage device 103. The electric power consumption device 105 includes a refrigerator 105a, an air conditioner 105b which is an air conditioning device, a television 105c which is a television receiver, a bath 105d, and the like. Further, the electric power consumption device 105 includes an electrically powered vehicle 106. The electrically powered vehicle 106 includes an electric vehicle 106a, a hybrid car 106b, and an electric bike 106c.

The charging device (power supply device) of the present technology is applied to the power storage device 103. The smart meter 107 has the function of measuring commercial electric power consumption and transmitting the measured consumption to an electric power company. The electrical grid 109 may be any one of DC power feeding, AC power feeding, and non-contact power feeding, or may combine a plurality of them.

The various sensors 111 are, for example, a human presence sensor, a luminance sensor, an object sensing sensor, a consumption electric power sensor, a vibration sensor, a contact sensor, a temperature sensor, an infrared sensor, and the like. Information acquired by the various sensors 111 is transmitted to the control device 110. A weather condition, human condition, and the like can be grasped in accordance with the information from the sensors 111, and the electric power consumption device 105 can be controlled automatically to minimize energy consumption. Further, the control device 110 can transmit information concerning the house 101 to an external electric power company or the like via the Internet.

Processing such as branching of an electric power line and DC-AC conversion is performed by the power hub 108. A communication system of the information network 112 connected to the control device 110 includes a method of using a communication interface such as a universal asynchronous receiver-transmitter (UART), and a method of utilizing a sensor network in accordance with a wireless communication standard such as Bluetooth (registered trademark), ZigBee (registered trademark), or Wi-Fi. The Bluetooth (registered trademark) system is applied to multimedia communication, and communication of one-to-many connection can be performed. ZigBee (registered trademark) uses a physical layer of Institute of Electrical and Electronics Engineers (IEEE) 802.15.4. IEEE 802.15.4 is the name of a short-range wireless network standard called personal area network (PAN) or wireless (W) PAN.

The control device 110 is connected to an external server 113. This server 113 may be managed by any of the house 101, an electric power company, and a service provider. Information that the server 113 transmits/receives is, for example, consumption electric power information, life pattern information, an electric power rate, weather information, natural disaster information, or information concerning an electric power transaction. These types of information may be transmitted/received to/from a home electric power consumption device (for example, a television receiver), or may be transmitted/received to/from an out-of-home device (for example, a mobile phone or the like). These types of information may be displayed on an apparatus having the display function, such as a television receiver, a mobile phone, or personal digital assistants (PDA), for example.

The control device 110 that controls each unit includes a central processing unit (CPU), a random access memory (RAM), and a read only memory (ROM), and in this example, is stored in the power storage device 103. The control device 110 is connected to the power storage device 103, the home power generation device 104, the electric power consumption device 105, the various sensors 111, and the server 113 with the information network 112, and has the function of adjusting the consumption of commercial electric power and the amount of power generation, for example. Note that the control device 110 may additionally have the function of performing an electric power transaction in an electric power market.

As described above, not only electric power of the centralized electric power system 102 such as the thermal power generation 102a, the nuclear power generation 102b, or the hydroelectric power generation 102c, but also generated electric power of the home power generation device 104 (solar power generation, wind power generation) can be stored in the power storage device 103. Therefore, even if generated electric power of the home power generation device 104 varies, it is possible to exert control such as making the amount of electric power to be delivered to the outside constant, or discharging as needed. For example, usage such as storing electric power obtained by solar power generation in the power storage device 103 and storing inexpensive late night electric power in the power storage device 103 during the night, and discharging and utilizing the electric power stored in the power storage device 103 in a time zone during the daytime in which the rate is high is possible.

Note that, in this example, an example in which the control device 110 is enclosed in the power storage device 103 has been described, whilst the control device 110 may be enclosed in the smart meter 107, or may be configured alone. Further, the power storage system 100 may be used for a plurality of houses in an apartment, or for a plurality of houses.

"Power Storage System in Vehicle as Application Example"

Figure 8:
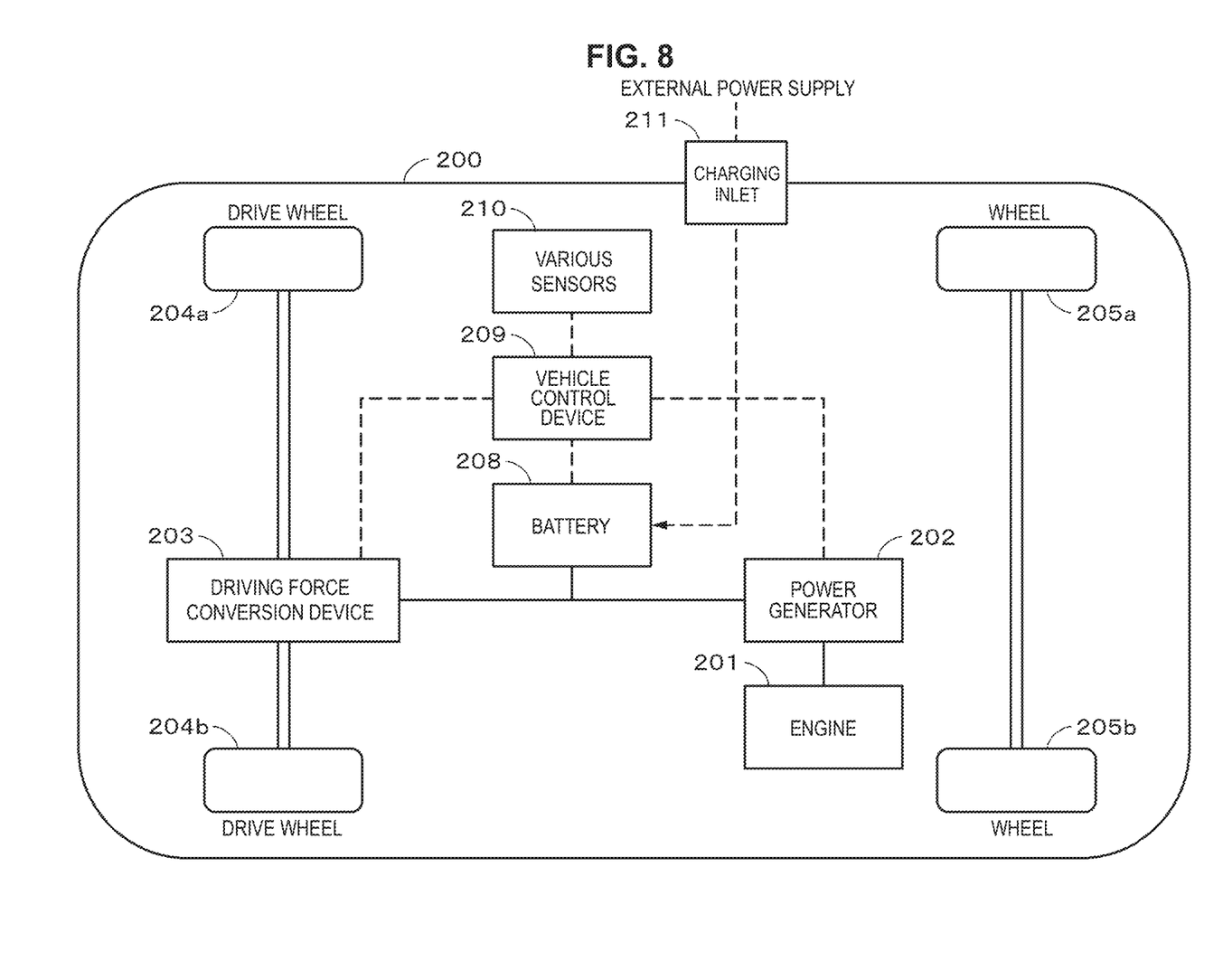
FIG. 8 is a block diagram showing another application example of the present technology.

An example in which the present technology is applied to a power storage system for a vehicle will be described with reference to FIG. 8. FIG. 8 schematically shows an example of a configuration of a hybrid vehicle in which a series hybrid system to which the present technology has been applied is adopted. The series hybrid system is a car that runs with an electric power-driving force conversion device using electric power generated by a power generator driven by the engine or that electric power once stored in the battery.

An engine 201, a power generator 202, an electric power-driving force conversion device 203, a drive wheel 204a, a drive wheel 204b, a wheel 205a, a wheel 205b, a battery 208, a vehicle control device 209, various sensors 210, and a charging inlet 211 are mounted on this hybrid vehicle 200. The charging device (power supply device) of the present technology described above is applied to this hybrid vehicle 200.

The hybrid vehicle 200 runs using the electric power-driving force conversion device 203 as a motive power source. An example of the electric power-driving force conversion device 203 is a motor. The electric power-driving force conversion device 203 operates with electric power of the battery 208, and a rotary force of this electric power-driving force conversion device 203 is transferred to the drive wheels 204a and 204b. Note that, by using direct current-alternating current (DC-AC) or inverse conversion (AC-DC conversion) at a necessary point, the electric power-driving force conversion device 203 is applicable whether it is an AC motor or a DC motor. The various sensors 210 control the engine speed via the vehicle control device 209, and control the opening (throttle opening) of a throttle valve not shown. A speed sensor, an acceleration sensor, an engine speed sensor, and the like are included in the various sensors 210.

The rotary force of the engine 201 is transferred to the power generator 202, and electric power generated by the power generator 202 with that rotary force can be stored in the battery 208.

When the hybrid vehicle 200 is decelerated by a braking mechanism not shown, a resistance force at the time of that deceleration is added to the electric power-driving force conversion device 203 as a rotary force, and regenerative electric power generated by the electric power-driving force conversion device 203 with this rotary force is stored in the battery 208.

By being connected to a power supply external to the hybrid vehicle 200, the battery 208 can also receive electric power supply from the external power supply using the charging inlet 211 as an input port, and store the received electric power.

Although not shown, an information processing device that performs information processing concerning vehicle control on the basis of information concerning a secondary battery may be provided. Examples of such an information processing device include an information processing device that provides a battery level display on the basis of information concerning the battery level, and the like.

Note that a series hybrid car that runs with a motor using electric power generated by an engine-driven power generator or that electric power once stored in the battery has been described above as an example. However, the present technology is also effectively applicable to a parallel hybrid car in which outputs of the engine and the motor both serve as driving sources, and three systems of running only with the engine, running only with the motor, and running with the engine and the motor are appropriately switched and used. Further, the present technology is also effectively applicable to a so-called electrically powered vehicle that runs by driving only with a driving motor without using the engine.

3. VARIANTS

One embodiment of the present technology has been specifically described above, whilst the present technology is not limited to the above-described one embodiment, but various variants based on the technical idea of the present technology is possible. For example, the configurations, methods, steps, shapes, materials, numeric values, and the like listed in the above-described embodiment are merely examples, and configurations, methods, steps, shapes, materials, numeric values, and the like different from them can be used according to necessity.

The first power supply circuit in the former stage may be a power supply circuit that does not use a PFC control system. The second power supply circuit in the latter stage may be a power supply circuit that controls the output with the pulse width rather than with the frequency. In addition, an LLC current resonant type converter of an appropriate system, such as a full-bridge type or half-bridge type, can be applied.

The secondary battery may be a battery other than the lithium ion secondary battery, and a system other than CCCV can be applied to the charging system depending on the secondary battery. Note that the constant current in the constant current control is sufficient if charging is performed at a current of a predetermined value, and may not be a current of a fixed and single value. Charging may be performed at currents of a plurality of predetermined values having different values.

Additionally, the present technology may also be configured as below.

(1)

A power supply device including:

a first power supply circuit capable of exerting control of both boosting and bucking;

a second power supply circuit configured to be supplied with an output of the first power supply circuit and cause an output to be controlled in accordance with a frequency or a pulse width; and a control unit configured to control the first and second power supply circuits, in which the control unit is configured to execute control while switching between first control in which the output of the first power supply circuit is made variable and the output of the second power supply circuit is accordingly made variable, and second control in which the output of the first power supply circuit is made constant and the output of the second power supply circuit is set to a predetermined output.

(2)

The power supply device according to (1), in which switching is made between a first charging state in which a secondary battery is charged while setting the output of the second power supply circuit to a predetermined current, and a second charging state in which, when a voltage of the secondary battery reaches a predetermined voltage, the secondary battery is charged while setting an output voltage of the second power supply circuit to a predetermined voltage, and the first control is executed in the first charging state, and the second control is executed in the second charging state.

(3)

The power supply device according to (2), in which in the first charging state, control is executed such that the output is set to the predetermined current by fixing the frequency or the pulse width of the second power supply circuit at an efficient value and making an output voltage of the first power supply circuit variable, and in the second state, control is executed such that the output is set to the predetermined voltage by controlling the output of the first power supply circuit to be fixed at a constant value and adjusting the frequency or the pulse width of the second power supply circuit.

(4)

The power supply device according to any one of (1) to (3), in which the first power supply circuit is a power factor correction converter, and the second power supply circuit is a DC-DC converter controlled by frequency modulation.

(5)

A charging device including:

a first power supply circuit capable of exerting control of both boosting and bucking;

a second power supply circuit configured to be supplied with an output of the first power supply circuit and to cause an output to be controlled in accordance with a frequency or a pulse width; and a control unit configured to control the first and second power supply circuits, in which the control unit is configured to execute control while switching between first control in which the output of the first power supply circuit is made variable and the output of the second power supply circuit is accordingly made variable, and second control in which the output of the first power supply circuit is made constant and the output of the second power supply circuit is set to a predetermined output.

(6)

A controlling method in which a control unit executes first control and second control for a first power supply circuit capable of exerting control of both boosting and bucking, and a second power supply circuit configured to be supplied with an output of the first power supply circuit and to cause an output to be controlled in accordance with a frequency or a pulse width, the first control is control in which an output of the first power supply circuit is made variable and the output of the second power supply circuit is accordingly made variable, and the second control is control in which the output of the first power supply circuit is made constant and the output of the second power supply circuit is set to a predetermined output.

(7)

Electronic equipment configured to receive supply of electric power from the power supply device according to any of (1) to (4).

(8)

An electrically powered vehicle including the power supply device according to any of (1) to (4).

REFERENCE SIGNS LIST 1 charging device
3 buck-boost power factor correction circuit
4 frequency modulation control DC-DC converter
7 battery
9 charging control circuit
10 constant voltage control circuit
11 constant current control circuit

The invention claimed is:

1. A power supply device comprising:
a first power supply circuit capable of exerting control of both boosting and bucking;
a second power supply circuit configured to be supplied with an output of the first power supply circuit and cause an output to be controlled in accordance with a frequency or a pulse width; and
a control unit configured to control the first and second power supply circuits, wherein
the control unit is configured to execute control while switching between first control in which the output of the first power supply circuit is made variable and the output of the second power supply circuit is accordingly made variable, and second control in which the output of the first power supply circuit is made constant and the output of the second power supply circuit is set to a predetermined output.

2. The power supply device according to claim 1, wherein
switching is made between a first charging state in which a secondary battery is charged while setting the output of the second power supply circuit to a predetermined current, and a second charging state in which, when a voltage of the secondary battery reaches a predetermined voltage, the secondary battery is charged while setting an output voltage of the second power supply circuit to a predetermined voltage, and
the first control is executed in the first charging state, and the second control is executed in the second charging state.

3. The power supply device according to claim 2, wherein
in the first charging state, control is executed such that the output is set to the predetermined current by fixing the frequency or the pulse width of the second power supply circuit at an efficient value and making an output voltage of the first power supply circuit variable, and
in the second state, control is executed such that the output is set to the predetermined voltage by controlling the output of the first power supply circuit to be fixed at a constant value and adjusting the frequency or the pulse width of the second power supply circuit.

4. The power supply device according to claim 1, wherein
the first power supply circuit is a power factor correction converter, and
the second power supply circuit is a DC-DC converter controlled by frequency modulation.

5. A charging device comprising:
a first power supply circuit capable of exerting control of both boosting and bucking;
a second power supply circuit configured to be supplied with an output of the first power supply circuit and to cause an output to be controlled in accordance with a frequency or a pulse width; and
a control unit configured to control the first and second power supply circuits, wherein
the control unit is configured to execute control while switching between first control in which the output of the first power supply circuit is made variable and the output of the second power supply circuit is accordingly made variable, and second control in which the output of the first power supply circuit is made constant and the output of the second power supply circuit is set to a predetermined output.

6. A controlling method wherein
a control unit executes first control and second control for a first power supply circuit capable of exerting control of both boosting and bucking, and a second power supply circuit configured to be supplied with an output of the first power supply circuit and to cause an output to be controlled in accordance with a frequency or a pulse width,
the first control is control in which an output of the first power supply circuit is made variable and the output of the second power supply circuit is accordingly made variable, and
the second control is control in which the output of the first power supply circuit is made constant and the output of the second power supply circuit is set to a predetermined output.

7. Electronic equipment configured to receive supply of electric power from the power supply device according to claim 1.

8. An electrically powered vehicle comprising the power supply device according to claim 1.

* * * * *